US007826204B2

(12) United States Patent
Wu et al.

(10) Patent No.: US 7,826,204 B2
(45) Date of Patent: Nov. 2, 2010

(54) MEDIA PLAYING DEVICE

(75) Inventors: Zhi-Liang Wu, Shenzhen (CN); Kun-Chih Hsieh, Taipei Hsien (TW); Wen-Hsing Lin, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 389 days.

(21) Appl. No.: 12/135,996

(22) Filed: Jun. 9, 2008

(65) Prior Publication Data

US 2008/0312762 A1 Dec. 18, 2008

(30) Foreign Application Priority Data

Jun. 13, 2007 (CN) ........................ 2007 1 0074951

(51) Int. Cl.
*H05K 5/00* (2006.01)
*G09G 5/00* (2006.01)
*H04R 25/00* (2006.01)

(52) U.S. Cl. ................... 361/679.01; 345/156; 381/182

(58) Field of Classification Search ................................ 361/679.01–679.45, 679.55–679.59, 724–727; 248/917–924; 345/156, 157, 168, 169; 381/182
See application file for complete search history.

(56) References Cited

U.S. PATENT DOCUMENTS

| | | | | |
|---|---|---|---|---|
| 2007/0060017 | A1 * | 3/2007 | Klusmeyer et al. | 446/397 |
| 2008/0165997 | A1 * | 7/2008 | Skurdal et al. | 381/334 |

* cited by examiner

*Primary Examiner*—Jayprakash N Gandhi
*Assistant Examiner*—Nidhi Desai
(74) *Attorney, Agent, or Firm*—Zhigang Ma

(57) ABSTRACT

A media playing device includes a housing with a cylindrical end and a middle portion, a knob, a PCB, a cover, and an attachment means. The end has a reduced diameter with respect to the middle portion, thus forming a step, and has an opening. The knob has a cylindrical inside surface with two protrusions and is attached to the housing with the two protrusions being located within the opening. The PCB has a micro controller unit (MCU) and at least one switch. The cover is detachably attached to the housing and together with the step limit the axial movement of the knob. The attachment means is used for attaching the cover to the housing. When the knob is rotated to a position where one of the contacting protrusions contacts the switch, the switch is activated and sends a signal to the MCU, the MCU executes an operation in response to the signal.

6 Claims, 11 Drawing Sheets

MEDIA PLAYING DEVICE

BACKGROUND

1. Technical Field

The present invention relates to media playing devices, especially to a media playing device having a rotatable control knob.

2. General Background

FIG. 11 shows a conventional music player 1, the conventional music player 1 has an LCD 11 and a 5 way navigation button 12. The 5 way navigation button 12 is provided for being pushed up, down, left, right, and in. to operate the music player 1.

Although having many advantages, the navigation button 12 has disadvantages too. In some cases, the navigation button 12 is too sensitive responds to unintentional light touches to result in unintended operations being executed. Users have to take time to get accustomed to the 5 way navigation button 12. Another problem with the 5 way navigation button 12 is that it is sometimes a little difficult to press it in. Users need to press hard to force the navigation button 12 with their thumbs, which may result in injury to the user or damage to the button 12.

Accordingly, there is a need to provide an easily operated media playing device.

SUMMARY

A media playing device is provided. In an exemplary form, the media playing device includes a housing with a cylindrical end and a middle portion, a turning knob, a printed circuit board (PCB) disposed within the housing, a side cover, and an attachment means. The end has a reduced diameter with respect to the middle portion, thus forming a step to support the turning knob, and has an opening. The turning knob has a cylindrical inside surface with two protrusions and is attached to the housing with the two protrusions being located within the opening. The PCB has a micro controller unit (MCU) and at least one switch. The side cover is detachably attached to the housing and together with the step of the housing limit the axial movement of the turning knob. The attachment means is used for attaching detachably the side cover to the housing. when the knob is rotated to a position where one of the contacting protrusions contacts the switch, the switch is activated to send a signal to the MCU, the MCU executes an operation in response to the signal.

Other novel features and advantages will be drawn from the following detailed description with reference to the attached drawings.

BRIEF DESCRIPTION OF THE DRAWINGS

The components of the drawings are not necessarily drawn to measuring scale, the emphasis instead being placed upon clearly illustrating the principles of the media playing device. Moreover, in the drawings, like reference numerals designate corresponding parts throughout the several views.

DETAILED DESCRIPTION OF EMBODIMENTS

Figure 1:
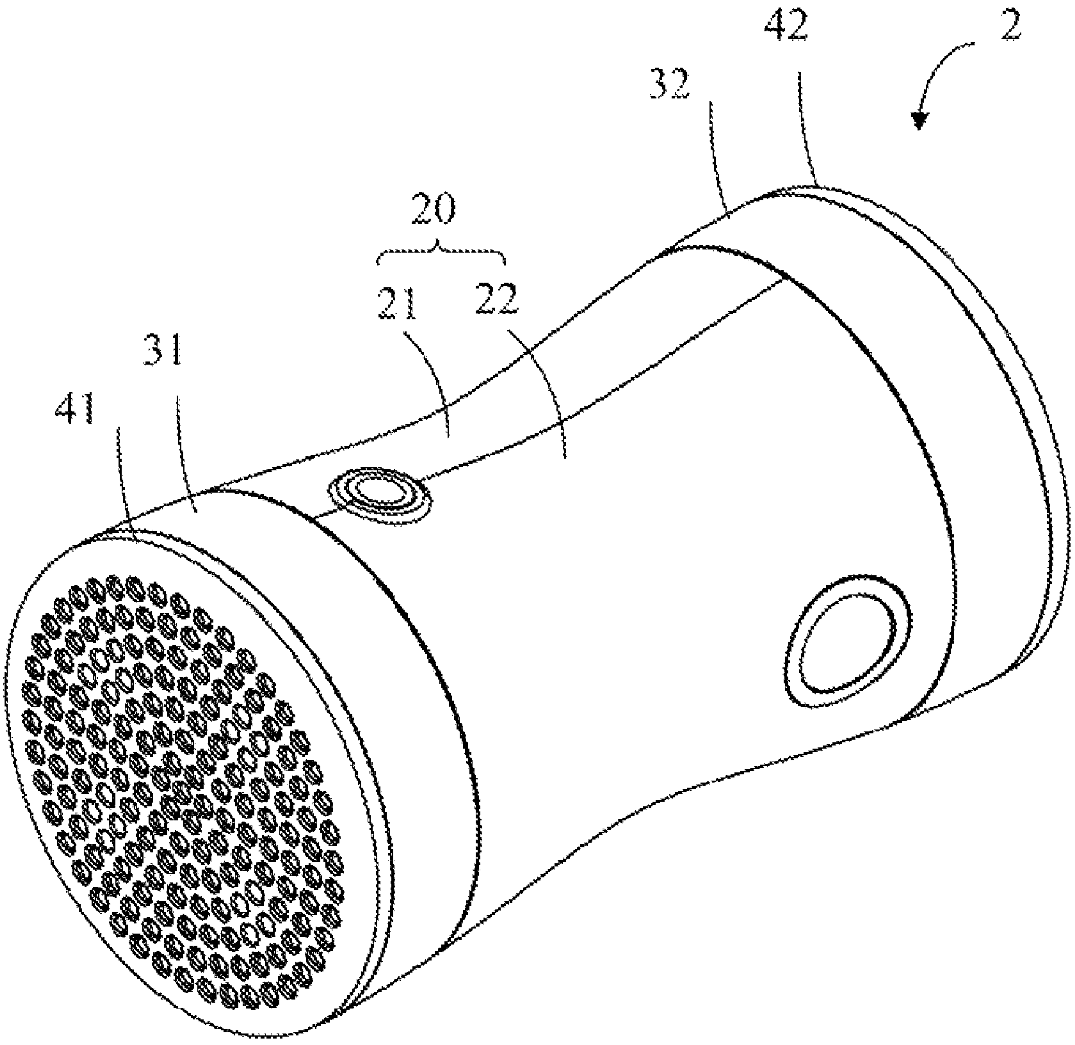
FIG. 1 is an isometric view of a media playing device in accordance with an embodiment of the present invention.

Referring to FIG. 1, a media playing device 2 has a casing 20 with a sandglass figure. The casing 20 includes two half casings 21 and 22 which are coupled together to form the casing 20.

Two turning knobs 31 and 32 are located at each end portion of the casing 20. The turning knobs 31 and 32 can be turned to rotate around the end portions of the casing 20 to operate the media playing device. A first side cover 41 and a second side cover 42 are detachably coupled to the casing 20 at respective end portions of the casing 20.

Figure 2:
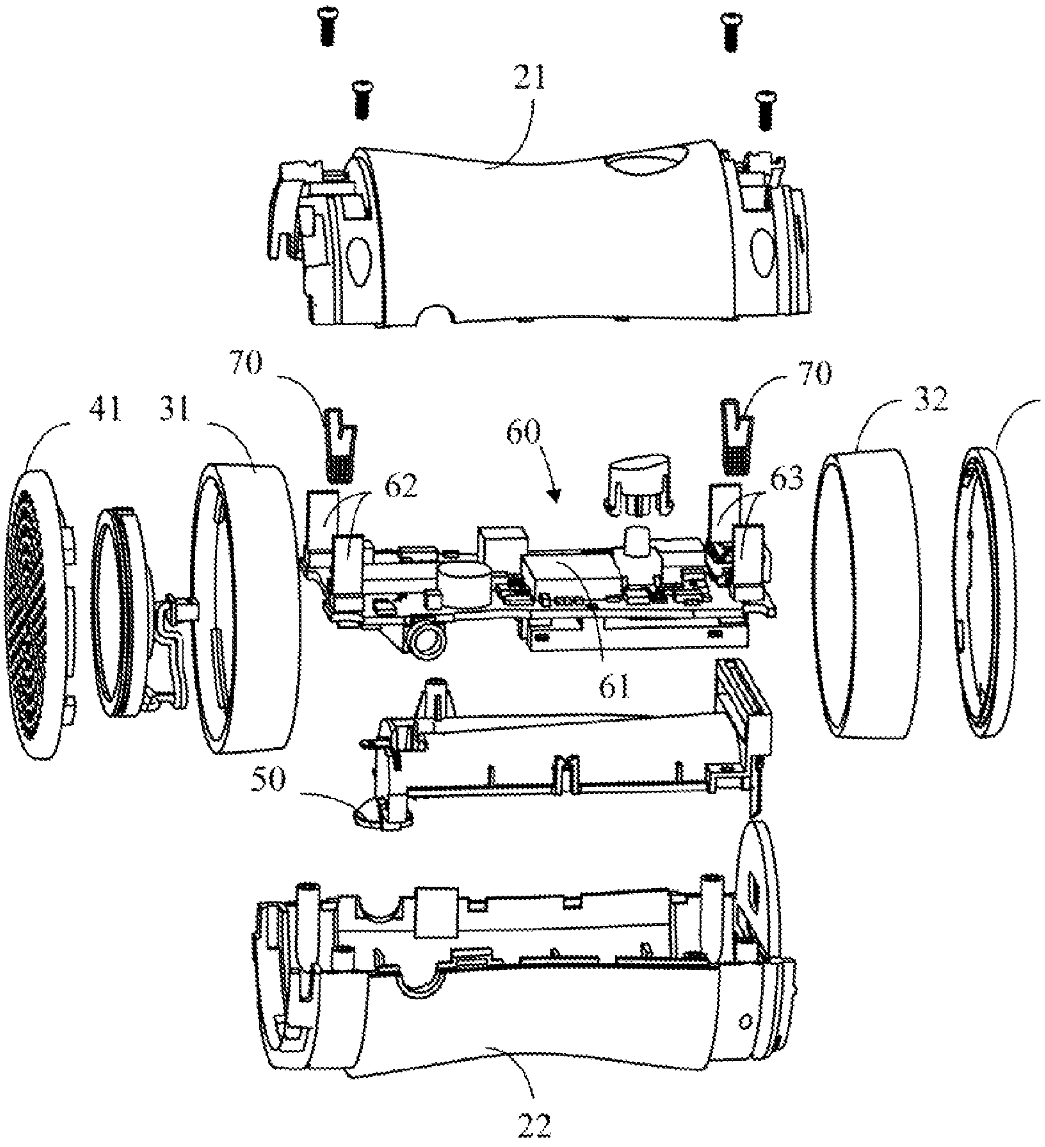
FIG. 2 is an exploded view of the media playing device of FIG. 1.

Referring to FIG. 2, a battery accommodating means 50, a print circuit board (PCB) 60, and two torsion springs 70 are disposed within the casing 20. The battery accommodating means 50 is secured to the half casing 22 and is configured for receiving a battery to supply power to the media playing device 2. The PCB 60 is secured to the battery accommodating means 50.

Figure 3:
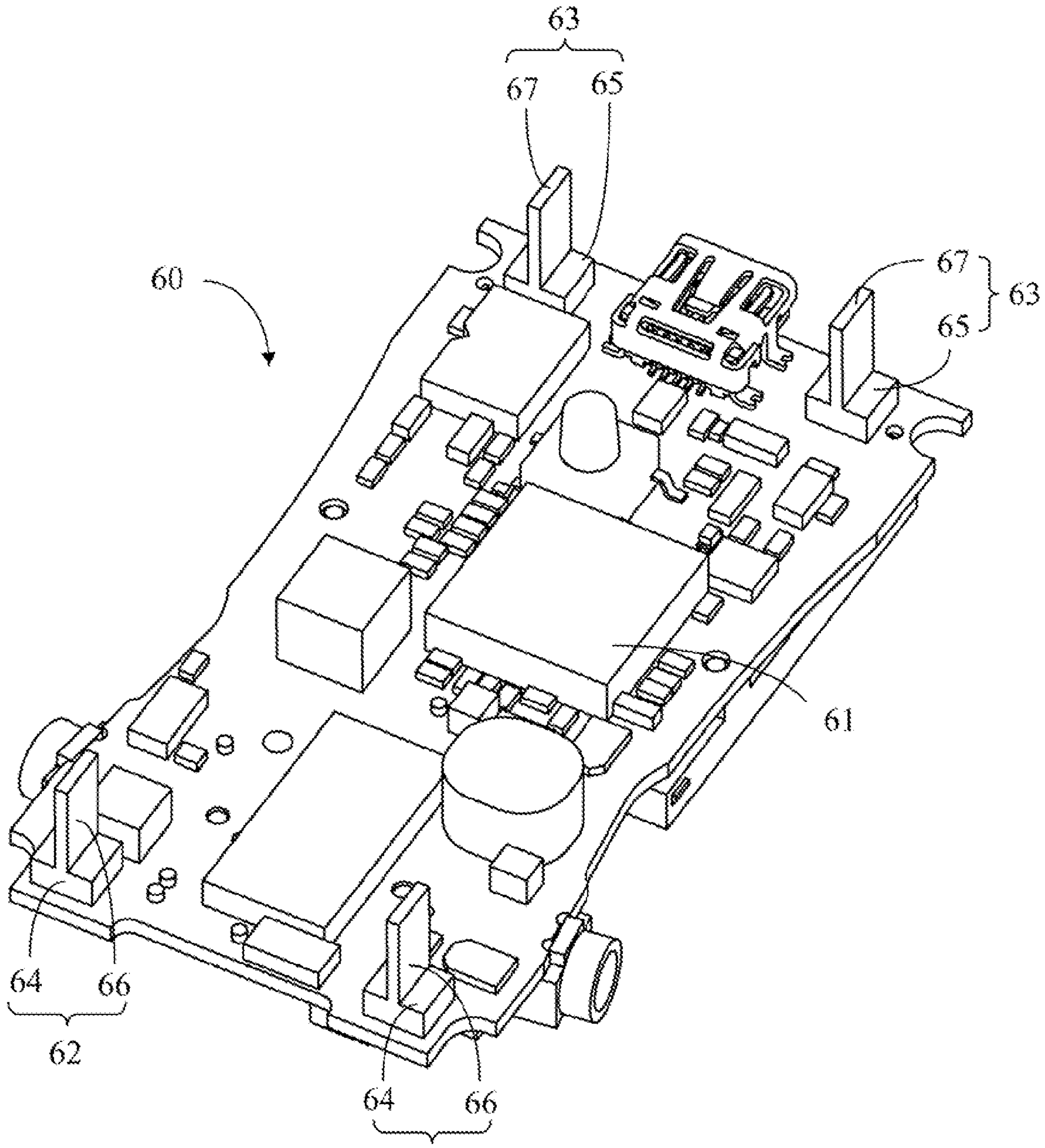
FIG. 3 is an isometric view of a PCB of the media playing device of FIG. 2.

Referring to FIG. 3, the PCB 60 includes a micro controller unit (MCU) 61 and two pairs of switches 62 and 63. The switches 62 and 63 have bases 64 and 65, and long thin tabs 66 and 67 extending from the bases 64 and 65. Each pair of the switches 62 and 63 are located at respective corners of the oblong PCB 60 and are configured for being activated to send a signal to the MCU 61.

Figure 4:
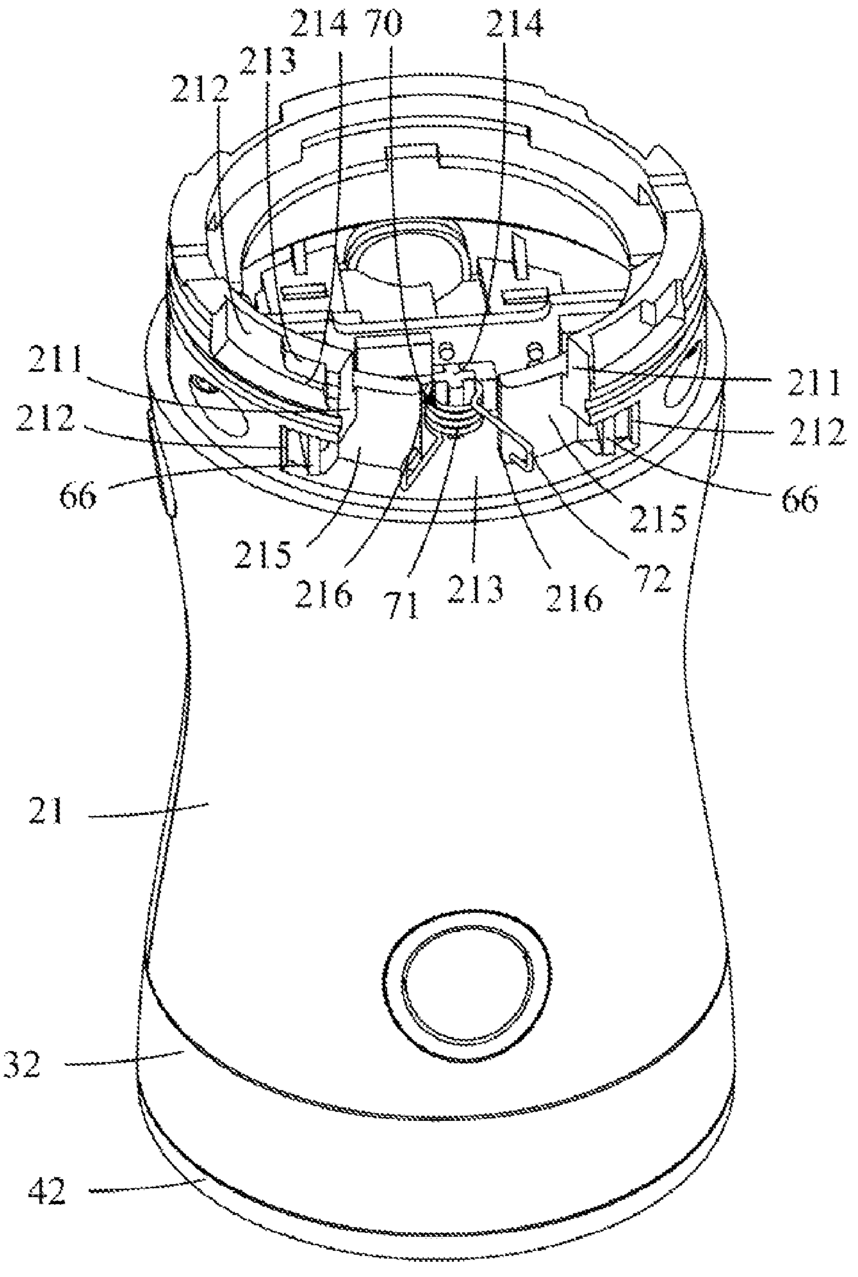
FIG. 4 is an isometric view of the media playing device of FIG. 1 with a first side cover and a corresponding turning knob omitted.
Figure 5:
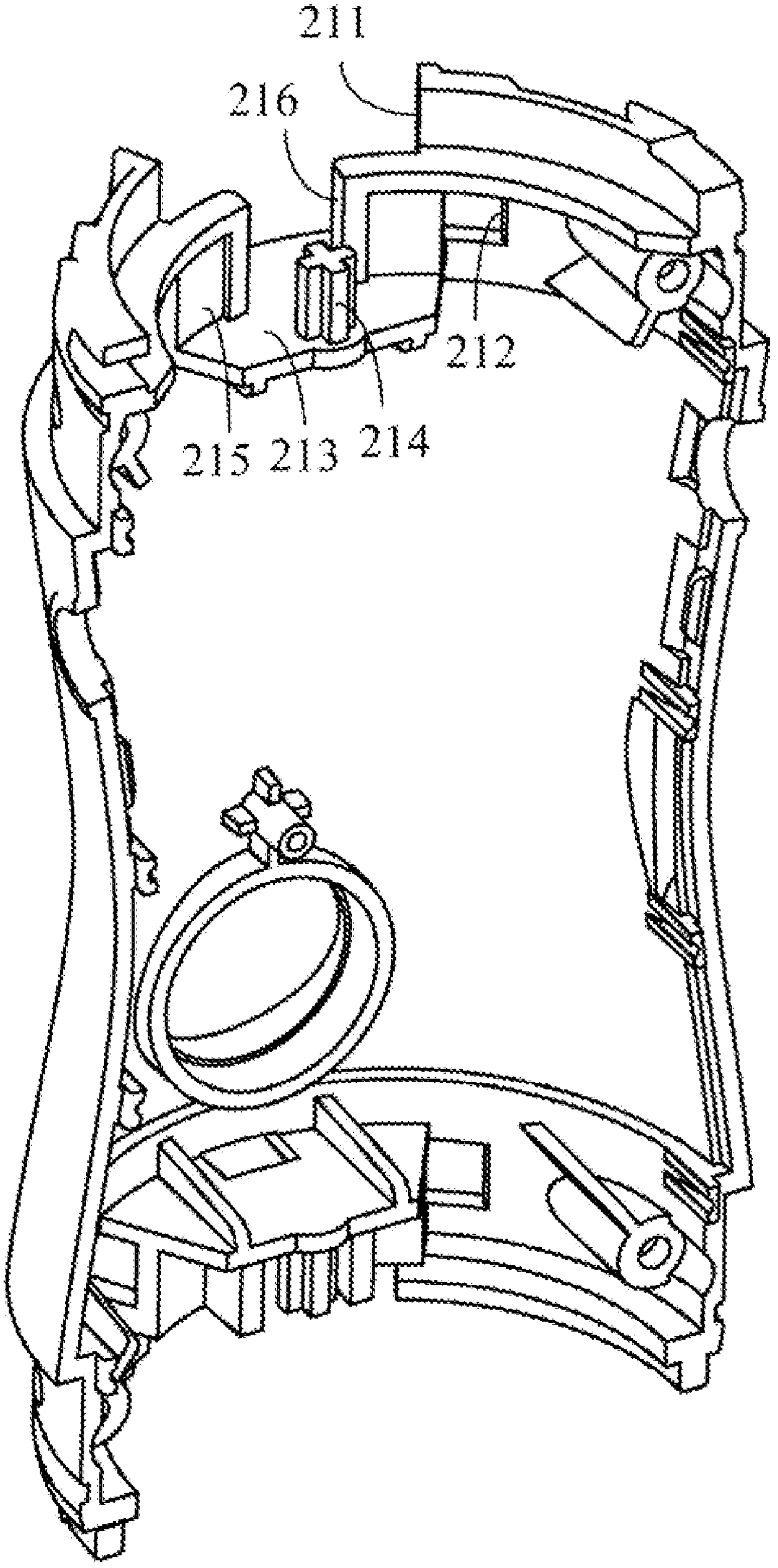
FIG. 5 is an isometric view of a half casing of the media playing device of FIG. 1.

Referring to FIGS. 4 and 5, the torsion spring 70 is secured to the half casing 21 and is configured for returning the turning knobs 31 and 32 to their original positions after their being rotated.

The half casing 21 has a opening 211 in a lip of the half casing 21. The half casing 21 also has a slot 212 extending circumferentially below the opening 211. The opening 211 communicates with the slot 212 and the width of the opening 211 is smaller than that of the slot 212, thus forming an upside down T type opening.

A planar portion 213 with a post 214 and a wall 215 extends radially inwardly from a bottom rim of the slot 212. The wall 215, which is located inside the half casing 21, extends axially from the planar portion 213 and has a cutout 216. The post 214, which extends axially from the planar portion 213, is located inward of the wall 215 near, and aligned with, the cutout 216. The distal ends of the tabs 66 of the switches 62 are disposed in the PCB 60 expose at the two ends of the slot 212 respectively (see FIG. 4).

The torsion spring 70 includes a coiled portion 71 and two legs 72. The torsion spring 70 is secured to the half casing 21 with the coiled portion 71 engaging with the post 214 and the spring legs 72 being clamped by the cutout 216, thus the torsion spring 70 is slightly compressed.

Figure 6:
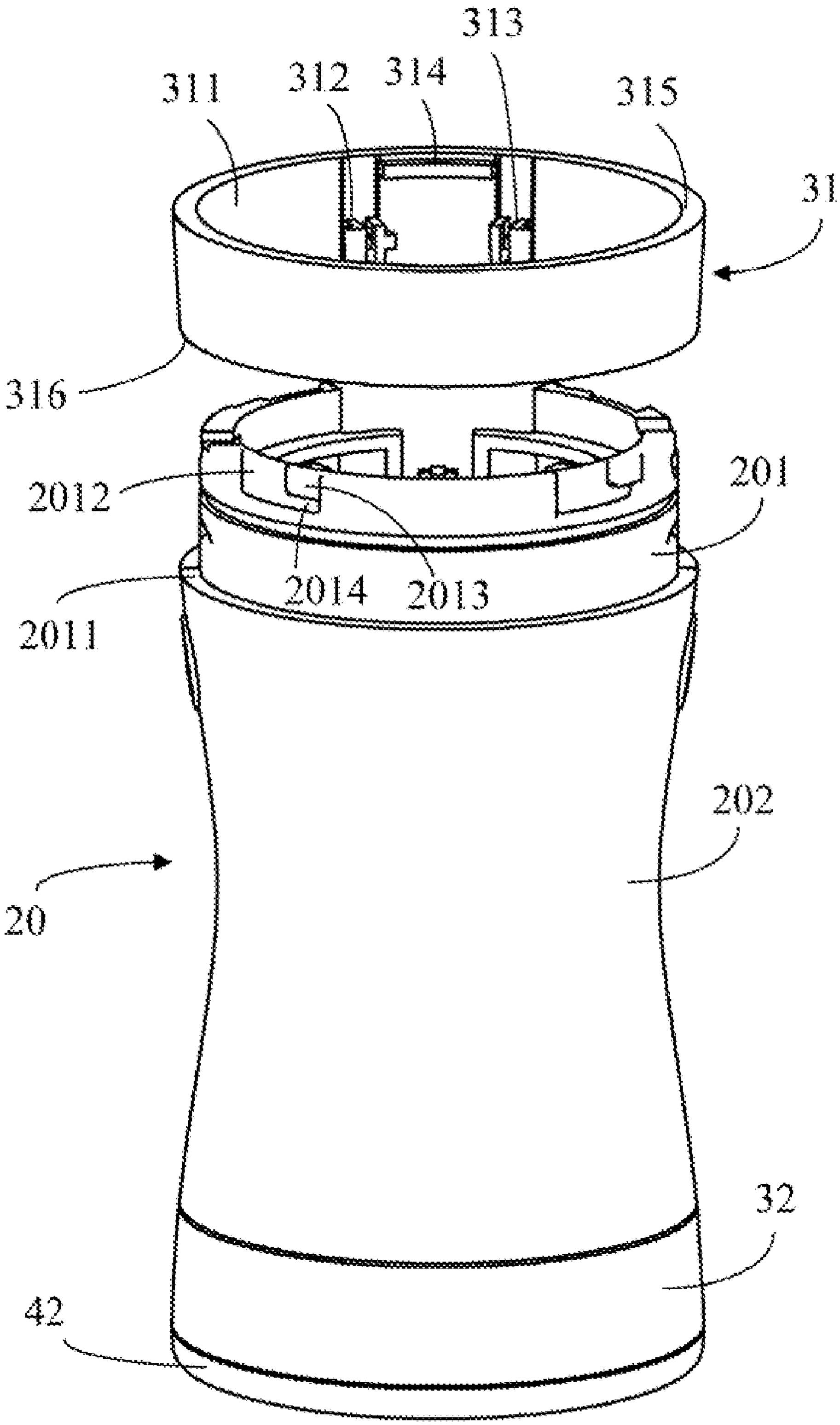
FIG. 6 is a partially exploded view of the media playing device of FIG. 1.
Figure 7:
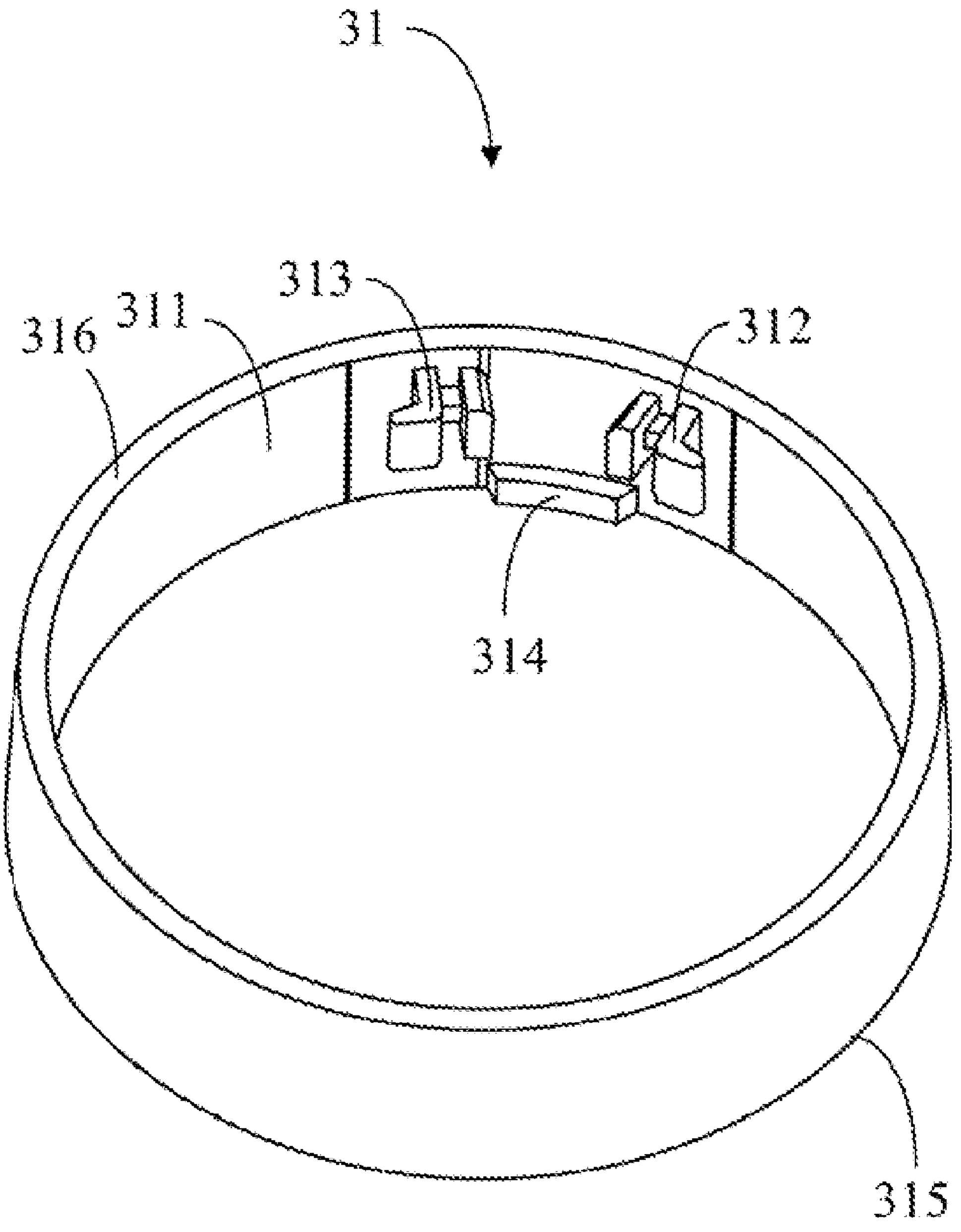
FIG. 7 is an isometric view of a turning knob of the media playing device of FIG. 1.
Figure 8:
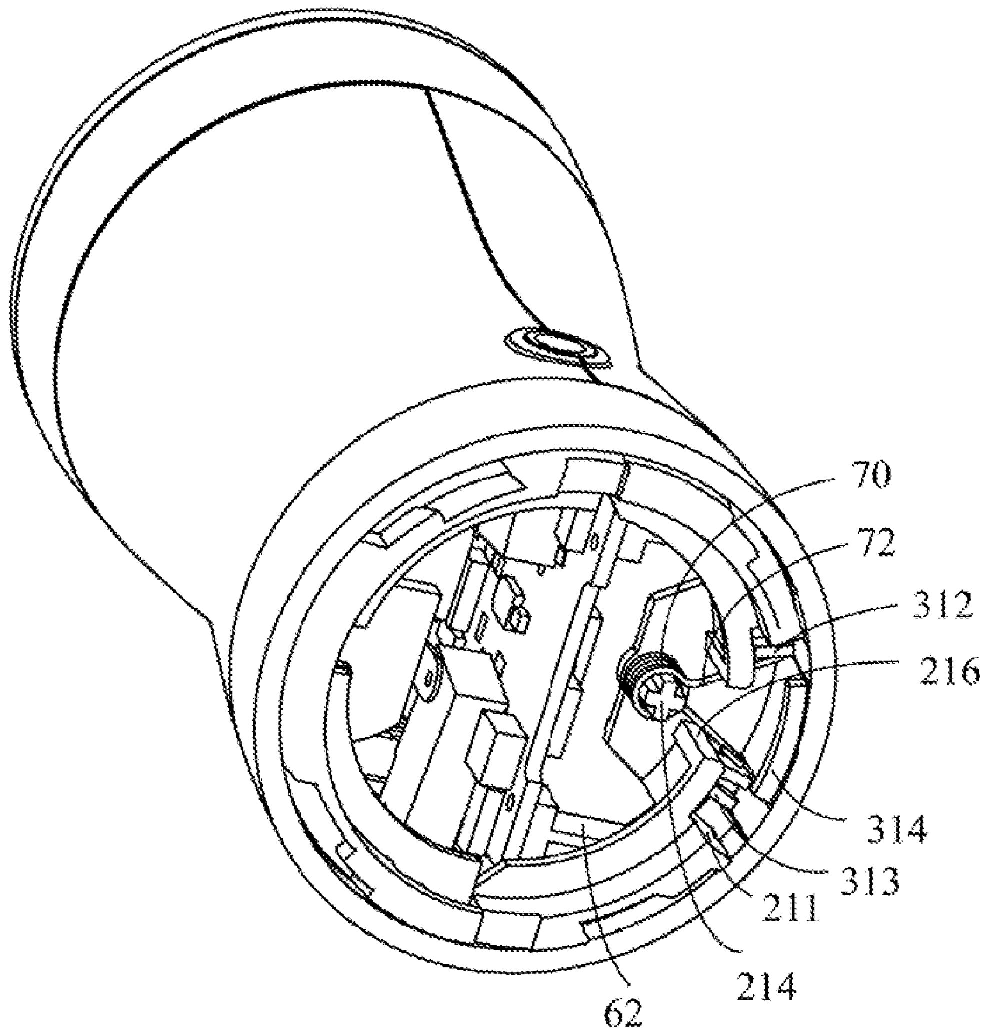
FIG. 8 is an isometric view of the media playing device of FIG. 1 with the first side cover omitted.

Referring to FIGS. 6 and 7, the casing 20 has a cylindrical end portion 201 and a middle portion 202. The end portion 201 has a reduced diameter relative to the middle portion 202, thus forming a step 2011 for supporting the turning knob 31. After the turning knob 31 is attached to the end portion 201, the outside surface of the turning knob 31 and the outside surface of the middle portion 202 join together smoothly.

The end portion 201 also has four recesses 2012 (two not shown in FIGS. 4 and 6) on the outside surface of the end portion 201. A protrusion 2013 extends from the bottom surface of the recess 2012, thus forming a receiving groove 2014.

The thin-wall turning knob 31 is hollow and includes a cylindrical inside surface 311 with two spaced contacting protrusions 312 and 313 and a protecting tab 314. The turning knob 31 also includes an upper end 315 and a bottom end 316. The spaced contacting protrusions 312 and 313 are disposed near the bottom end 316. The protecting tab 314 is disposed near the upper end 315.

Referring to FIG. 7, after the turning knob 31 is attached to the casing 20, the protecting tab 315 is located within the opening 211 and the contacting protrusions 312, 313 are located within the slot 212 and are pressed against distal ends of the two legs 72 of the torsion spring 70.

The turning knob 31 can be rotated in a clockwise or counterclockwise direction to control the media playing device 2. When the turning knob 31 is rotated in the clockwise direction, for example, the contacting protrusion 312 pushes the spring leg 72 to move in the slot 212 with the rotation of the turning knob 31. After the turning knob 31 is rotated to a position where the contacting protrusion 312 contacts the switch 62, a signal is generated by the switch 62 and is sent to the MCU 61. The MCU 61 thus executes an operation, such as adjusting a volume of the media playing device 2.

The protecting tab 314 moves with the rotation of the turning knob 31 and cooperates with the side surface of the opening 211 to stop the rotation of the turning knob 31. That is, after the contacting protrusion 312 or 313 contacts the switch 62, further rotation of the turning knob 31 is stopped when the protecting tab 314 contacts against one of the side surface of the opening 211, thereby preventing the switch 62 from being deformed too much to be damaged.

Figure 9:
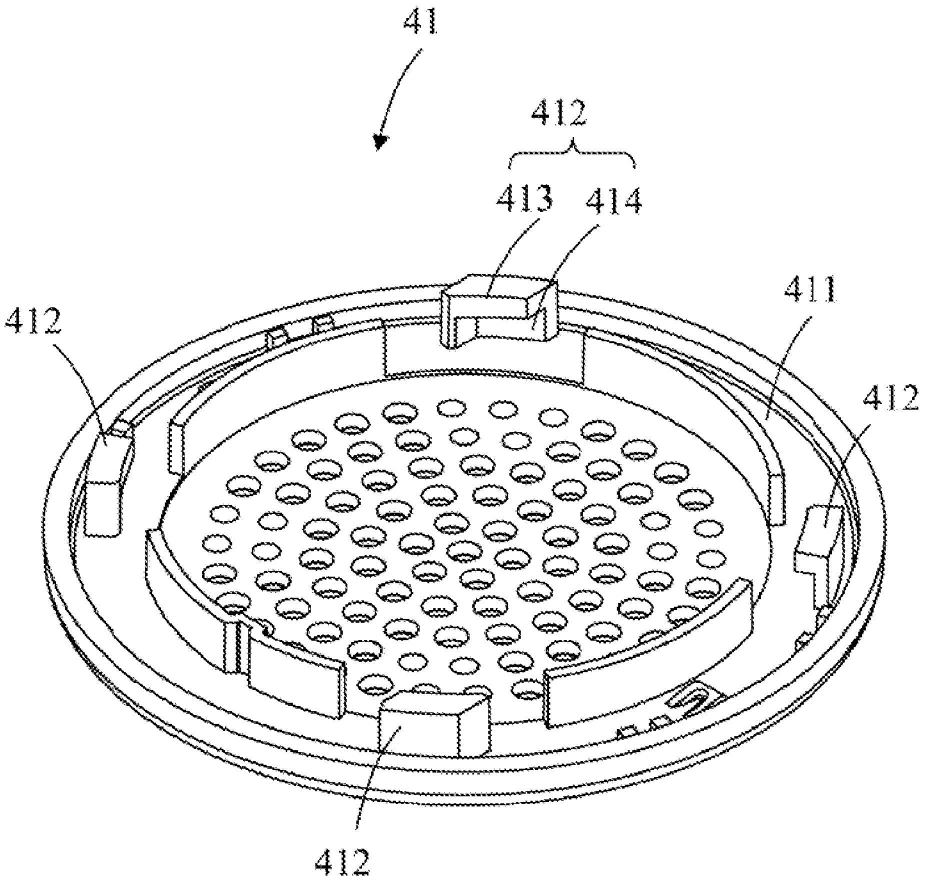
FIG. 9 is an isometric view of the first side cover of the media playing device of FIG. 1.

Referring to FIG. 9, the first side cover 41 includes a bottom surface 411 with four hooks 412 extending axially therefrom. The hook 412 has an upright wall 413 and an angled wall 414. The angled wall 414 joins radially inwardly the upright wall 413 with a right angle.

Figure 10:
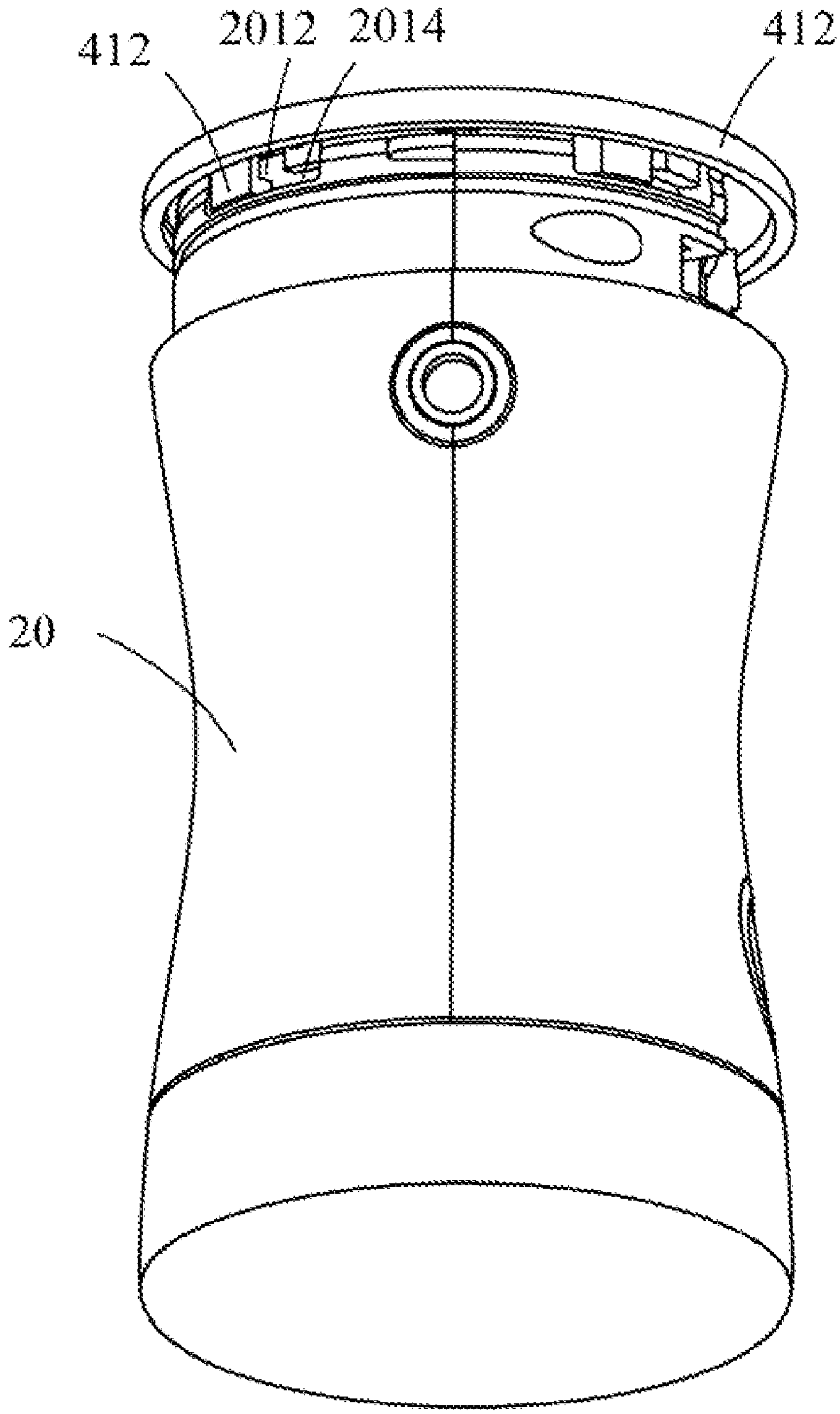
FIG. 10 is an isometric view of the media playing device of FIG. 1 with the turning knob omitted.
Figure 11:
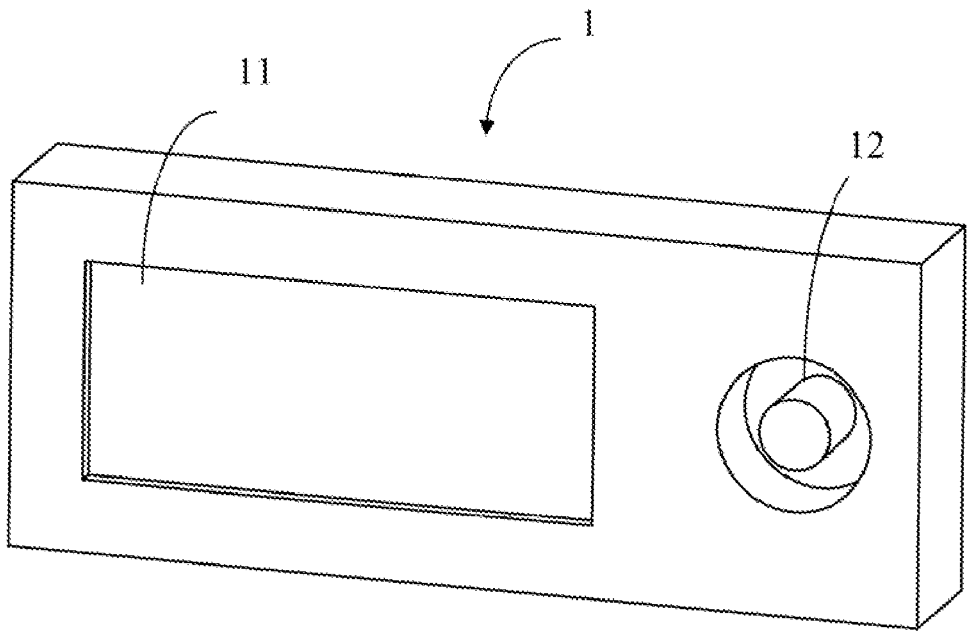
FIG. 11 (Related Art)
FIG. 11 is a schematic view of a conventional music player.

FIG. 10 shows that the first side cover 41 is disposed in a loose position with respect to the casing 20 with the turning knob 31 being omitted. In the illustrated position, the hooks 412 of the first side cover 41 are respectively received in the recesses 2012 of the end portion 201. In attaching the first side cover 41 to the casing 20, the first side cover 41 is rotated in a counterclockwise direction until the angled walls 414 of the hooks 412 are received in the receiving groove 2014. The attached first side cover together with the step 2011 of the casing 20 hold the turning knob 31 in position, thus limiting an axial movement of the turning knob 31.

The turning knob 32 is attached to the casing 20 in the same way as the turning knob 31 is attached to the casing 20. The second side cover 42 is attached to the casing 20 in the same way as the first side cover 41 is attached to the casing 20.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A media playing device comprising:

a housing including a middle portion and a cylindrical end portion, the cylindrical end portion shrinking radially relative to the middle portion to form a step and having an opening;

a hollow turning knob with a cylindrical inside surface having two spaced contacting protrusions extending radially inwardly therefrom, the hollow turning knob being attached to the cylindrical end portion and the two contacting protrusions being located within the opening;

a PCB disposed within the housing having an micro controller unit and at least one switch, the switch being contacted to activate;

a side cover detachably attached to the cylindrical end portion cooperating with the step to limit an axial movement of the hollow turning knob; and attachment means on the cylindrical end portion and the side cover for detachably attaching the side cover to the housing, wherein, when the hollow turning knob is rotated to a position where one of the contacting protrusions contacts the switch, the switch is activated to send a signal to the micro controller unit, the micro controller unit executes an operation in response to the signal.

2. The media playing device according to claim 1, wherein the side cover comprises a bottom surface having at least one hook extending axially therefrom, the cylindrical end portion comprises at least one groove, the hook cooperates with the groove to constitute the attachment means.

3. The media playing device according to claim 1 further comprising a torsion spring for returning the knob to its original position after the switch being activated.

4. The media playing device according to claim 1, wherein the media playing device has a sandglass figure.

5. The media playing device according to claim 1, wherein the opening of the cylindrical end portion is an upside down T type opening.

6. The media playing device according to claim 1, wherein the hollow turning knob includes a protecting tab, the protecting tab is located within the opening of the cylindrical end portion after the hollow turning knob is attached to the housing, and cooperates with the opening to stop rotating of the hollow turning knob after the switch is activated.

* * * * *